United States Patent [19]

Keidl

[11] 4,054,816
[45] Oct. 18, 1977

[54] SWEEP CIRCUIT FOR CATHODE-RAY TUBE DISPLAY

[75] Inventor: Steven Dennis Keidl, Rochester, Minn.

[73] Assignee: International Business Machines Corporation, Armonk, N.Y.

[21] Appl. No.: 702,308

[22] Filed: July 2, 1976

[51] Int. Cl.² .................... H01J 29/70; H01J 29/72
[52] U.S. Cl. .................... 315/387; 315/379; 315/397
[58] Field of Search ............... 315/387, 389, 396, 397, 315/379

[56] References Cited

U.S. PATENT DOCUMENTS

| 3,337,767 | 8/1967 | Montrichard et al. | 315/397 |
| 3,760,222 | 9/1973 | Smith | 315/397 |
| 3,947,723 | 3/1970 | Thompson | 315/389 |

Primary Examiner—Maynard R. Wilbur
Assistant Examiner—T. M. Blum

[57] ABSTRACT

A recurrent digital sweep signal starts an integrator fed by a constant current. The integrator includes push-pull Darlington stages, which act as alternately conducting controlled current sources for split deflection coils outside the integrator feedback loop. A phase shifter provides arcsine correction. A time-out circuit avoids excessive dissipation if the sweep signal should be lost.

9 Claims, 2 Drawing Figures

SWEEP CIRCUIT FOR CATHODE-RAY TUBE DISPLAY

BACKGROUND

The present invention relates to electrical discharge devices, and more particularly concerns deflection or sweep circuits for cathode-ray tubes.

Although not limited thereto, the present invention finds utility in alphanumeric data displays using a raster or dot-matrix technique. The sweep for such a display must be quite accurate and stable in both initial position and velocity, since small motions in the displayed characters would be irritating and fatiguing to an operator. On the other hand, the widespread use of cathode-ray tube (CRT) displays requires a low cost per unit and adjustment-free operation. Sweep or deflection circuits for previous displays of this type have tended to sacrifice economy to obtain accuracy and stability; e.g., they have depended upon such things as component adjustments to ensure track centering, accurate matching of component values, and precise specification of parameters such as deflection-coil inductance and resistance. Conventional CRT displays also tend to have a high power dissipation, which increases operating costs and shortens component life. All of these factors add to both the initial cost and the continuing expense of CRT displays.

THE INVENTION

The present invention proposes a CRT deflection circuit which has high accuracy and stability, yet which is low in cost and power dissipation and needs no adjustments. The invention also incorporates several desirable features such as arcsine correction and protection against loss of input, at very little additional cost.

Basically, the present invention includes an operational integrator receiving a single reference current which determines both the velocity and the starting position for a sweep across the CRT. A pair of alternating output drivers have a common current sensor within the feedback loop of the integrator. This forces the drivers to act as controlled current sources for split deflection coils which are outside the feedback loop. Arcsine correction is provided by a phase-shift network in the integrator loop. Loss of drive is rendered harmless by a time-out single-shot.

Other features and advantages of the present invention, as well as modifications obvious to those skilled in the art, will become apparent from the following description of a preferred embodiment thereof, taken in conjunction with the accompanying drawings.

DRAWINGS

DESCRIPTION

Figure 1:
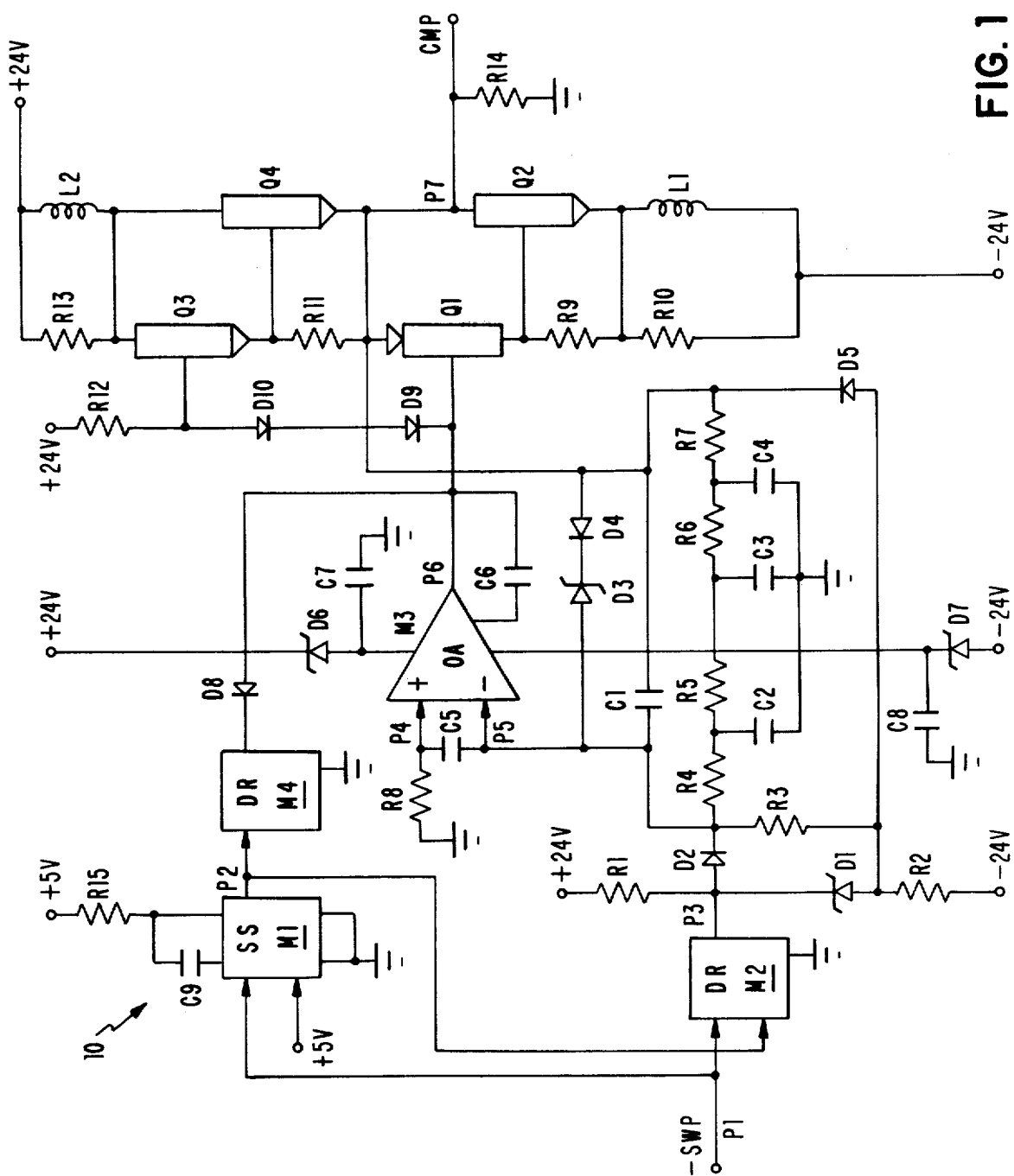
FIG. 1 is a circuit diagram showing a sweep circuit according to the invention.

FIG. 1 shows a circuit 10 of a preferred sweep generator according to the present invention. The falling edge of a digital signal at point P1 triggers single-shot multivibrator module M1 and enables driver module M2. When either of the inputs P1, P2 is down, M2 connects point P3 to ground through an internal transistor. P3 is coupled to the cathode of Zener diode D1, which is positioned between +24V and −24V supply voltages by resistors R1, R2. Current-source precision resistor R3 connects to P3 through gating diode D2, and to integrator capacitor C1 in the negative feedback loop of operational amplifier module M3. Saturation of M3 is prevented by limiting the voltage across C1 by means of Zener D3 and diode D4; in normal operation, these diodes will never conduct. Another diode, D5, ties the anode voltage of D1 to the other side of C1.

The feedback loop of amplifier M3 also includes a three-section tapered RC phase-shift network R4–R7, C2–C4. The non-inverting input P4 of amplifier M3 is grounded through precision biasing resistor R8, and is coupled to inverting input P5 through compensation capacitor C5. Stabilizing capacitor C6 is tied to the output P6 of M3. Power-supply bypass capacitors C7, C8 also aid in preventing oscillation within M3. The available ±24V supplies are reduced within the limits of M3 by Zeners D6, D7. Output P6 is also tied to driver module M4 through diode D8, so as to clamp P6 to ground if M1 should time out, as described hereinbelow.

Amplifier output P6 feeds Darlington (Q3, Q4) and NPN/PNP composite (Q1, Q2) output drivers. The base of PNP predriver transistor Q1 receives signal P6 directly. Its associated NPN output transistor Q2 includes conventional biasing resistor R9. One half of the deflection coil, L1, connects the emitter of Q2 to the −24V supply, and is shunted by damping resistor R10. The other Darlington driver has two NPN transistors, Q3 and Q4, and biasing resistor R11. To compensate for the two base-emitter voltage drops of Q1 and Q3, the base of Q3 is raised two diode drops above P6 by D9, D10 and R12. The other half of the deflection coil, L2, is shunted by R13, and is coupled between the collector of Q4 and the +24V supply. The emitter of Q4 is tied to the collector of Q2. This junction, P7, is grounded through current-sensing resistor R14. FIG. 1 shows that P7 is the far end of the feedback loop for operational amplifier module M3. The voltage at P7 may also be output as an external compensation voltage CMP for other circuits (not shown) which do not form a part of this invention.

Typical component values are given in the following table.

| | |
|---|---|
| R1 | 820ohm |
| R2 | 1.39kohm |
| R3,R8 | 6.350kohm, 1% |
| R4 | 7.5kohm |
| R5 | 1.5kohm |
| R6,R7 | 2.2kohm |
| R9,R11 | 470ohm |
| R10,R13 | 430ohm |
| R12 | 9.1kohm |
| R14 | 12ohm, 1% |
| R15 | 1kohm |
| C1 | 0.106uf, 1% |
| C2,C3,C4 | 0.1uF |
| C5 | 470pf |
| C6 | 30pF |
| C7,C8 | 5nF |
| C9 | 6.8uF |
| L1,L2 | 6.6mH (11.3ohms) |
| D1 | 6V |
| D3 | 8V |
| D6,D7 | 8V |
| M1 | SN74123 |
| | (14, 15, 4, 1, 8, 16, 2) |
| M2,M4 | SN75451 |
| | (5, 4, 6, 7; 3, 4, 1) |
| M3 | uA741 |
| | (7, 6, 5, 4, 2, 3) |

The parenthesized numbers for M1-M4 represent the pin numbers (assuming dual in-line packages) for the leads shown in FIG. 1, going clockwise around the module symbol from the upper left corner.

OPERATION

Figure 2:
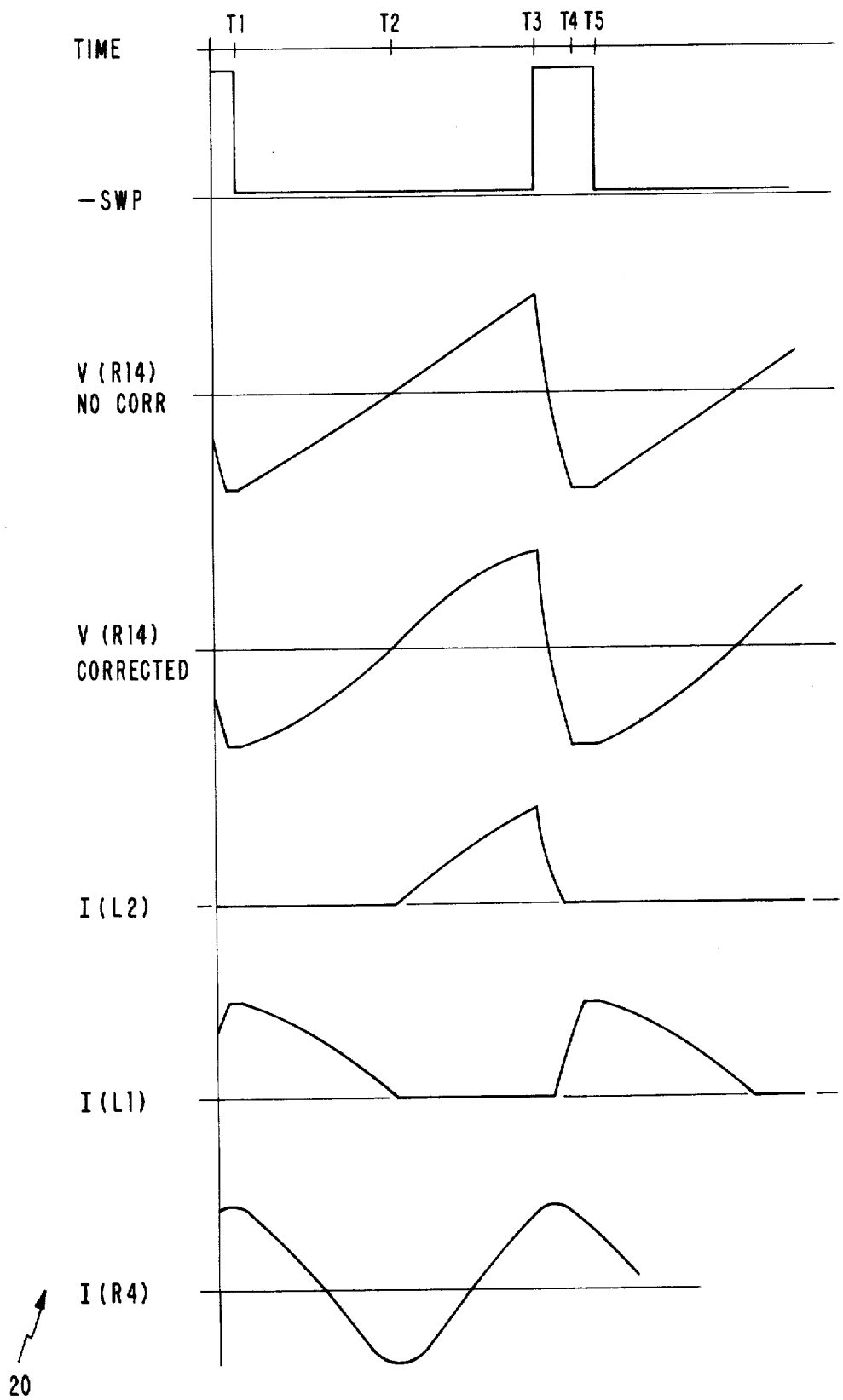
FIG. 2 shows various waveforms useful in explaining the operation of the circuit of FIG. 1.

FIG. 2 shows a set of waveforms 20 useful in explaining of deflection circuit 10. A sweep cycle is initiated by the falling edge of the digital −SWP trigger signal (point P1 in FIG. 1) at time T1. Module M2 grounds point P3, which allows R3 to pump a reference current I(R3) out of capacitor C1. This current has a constant value, since the voltage across R3 is held constant by Zener D1.

Operational amplifier M3 and the Darlington output stages Q1-Q4 form an integrator by virtue of capacitor C1 in a feedback loop between point P7 and inverting input P5. Therefore, the constant current away from P5 would cause the voltage across R14 to increase linearly, as shown in the "No Correction" waveform of FIG. 2, according to the relation $$V_{R14} = \frac{(V_{D1})t}{(R1)(C1)} - V_{D1}$$

It is well known, however, that the electron-beam motion of a cathode-ray tube is non-linear with respect to deflection-coil currents. The phase shift through the R4-R7, C2-C4 network modifies the current from R3 to produce a conventional arcsine correction. The I(R4) curve in FIG. 2 is a magnified representation of the current through R4, which is proportional to the amount of correction being applied to V(R14). The V(R14) "Corrected" waveform shows the resulting sweep voltage across R14. Further references to V(R14) will be to the corrected version.

Between time T1 and time T2, V(R14) is below ground potential, so that Q3 and Q4 are cut off. Q1 and Q2 form a controlled current sink, by virtue of current-sensing resistor R14 in the feedback loop of amplifier M3. This forces the current in deflection coil section L1 to be $$I(L1) = \frac{V(R14)}{R14}$$

even though L1 itself is outside the feedback loop of the integration circuit around M3. As shown in FIG. 2, I(L1) is constrained to follow the value of V(R14) until this voltage reaches ground at T2. Thereafter, Q1 and Q2 are reverse-biased, so that $I(L1)=0$ for the remainder of the cycle.

As V(R14) rises above ground potential at time T2, Q3 and Q4 become forward-biased and begin to conduct. These two transistors form a current source whose value is also controlled by the voltage across R14. Between T2 and T3, then, $$I(L2) = \frac{V(R14)}{R14}$$

as shown in FIG. 2. $I(L1)=0$ during this interval. Since current flows in only half of the deflection coil (either L1 or L2) at once, the total power dissipation of circuit 10 is decreased considerably.

The rising edge of −SWP at T3 initiates a retrace or flyback interval. Module M2 disconnects P3 from ground, allowing R1 to force a large reset current through D2, to reset the sweep voltage V(R14) to −V(D1) by time T4, before the next cycle begins at T5. The reset action is terminated when a forward bias on D5 causes the current through diode D2 to decrease until $I(D2)=I(R1)$, less a small correction current I(R4). At that point, there is no further current available to charge C1, so V(R14) remains clamped at a constant initial voltage until a new cycle begins at time T5. The value of this clamp voltage, of course, determines the location of the beginning of each sweep on the cathode-ray tube face. This clamp voltage is proportional to the Zener voltage of D1, since V(D1) determines the value of I(R3), which in turn sets the clamp voltage. But it has already been shown that V(D1) also directly controls the rate of beam travel across the tube face, since the integrator capacitor C1 charges at a rate which is also directly proportional to I(R3), as modified by the correction current I(R4). Therefore, tracking between the starting point and the rate of the sweep is inherent in circuit 10, without any requirement for matched components. This feature keeps the sweep accurately centered on the CRT with variations in the voltage of reference diode D1.

Loss of the −SWP control signal could lead to excessive dissipation in Q2 or Q4. Retriggerable single-shot M1 never times out as long as the −SWP pulses occur above a certain repetition rate, determined by timing components R15, C9. But a fault in −SWP allows P2 to go high, which forces a new sweep cycle via the connection to another input of driver M2. A high value at P2 also causes driver M4 to couple amplifier output P6 to ground through diode D8. This cuts off Q1 and Q2, preventing any current flow through L1. Also, since the integrator loop is now broken, the sweep cycle cannot progress to the point where Q3, Q4 would turn on, so that L2 carries no current. The next leading edge of −SWP triggers M1 and begins a normal sweep cycle.

I claim as my invention:

1. A sweep circuit for a cathode-ray tube display, comprising:
    a reference for producing a constant reference signal;
    an integrator responsive to said reference signal and having a feedback loop for producing a drive signal with a rate of change determined by said reference signal; and
    driver means being responsive to said drive signal for passing a time-varying output current through a deflection-coil means, said driver means having a sensor receiving said output current and coupled to said feedback loop, said deflection coil means being connected outside said feedback loop; and
    trigger means coupled to said integrater and to said reference, for resetting said drive signal to a value determined by said reference signal.

2. The sweep circuit of claim 1, wherein said deflection-coil means comprises a pair of split deflection coils, and wherein said driver means comprises a pair of drivers, each of said drivers being coupled to one of said coils and to said current sensor.

3. The sweep circuit of claim 2, wherein said current sensor is a resistor coupled to both of said drivers.

4. The sweep circuit of claim 3, wherein each of said drivers includes a transistor coupled between said resistor and one end of one of said coils, another end of said one coil being coupled to a supply voltage.

5. The sweep circuit of claim 1, wherein said reference signal is a reference current flowing in a first direction.

6. The sweep circuit of claim 5, wherein said trigger means produces a variable reset current flowing oppositely to said reference current, said reset current decreasing to the value of said reference current at a predetermined voltage depending upon the value of said reference current.

7. The sweep circuit of claim 1, wherein said trigger means is responsive to a recurrent external trigger signal.

8. The sweep circuit of claim 7, wherein said trigger means includes means for producing an internal trigger signal at a rate lower than a nominal rate of said external signal, said last-named means being inhibited by said external signal.

9. The sweep circuit of claim 1, wherein said feedback loop includes a phase shifter for modifying said time-varying drive signal.

* * * * *